(12) United States Patent
Huang et al.

(10) Patent No.: US 12,190,955 B2
(45) Date of Patent: Jan. 7, 2025

(54) MEMORY DEVICE WITH DUMMY WORD LINE, SYSTEM AND METHOD FOR PROGRAMMING THEREOF

(71) Applicant: YANGTZE MEMORY TECHNOLOGIES CO., LTD., Wuhan (CN)

(72) Inventors: Xueqing Huang, Wuhan (CN); Wei Huang, Wuhan (CN); Xing Zhou, Wuhan (CN); Chan Wang, Wuhan (CN); Kang Li, Wuhan (CN); Cong Luo, Wuhan (CN); Fengxiang Gao, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 176 days.

(21) Appl. No.: 17/881,231

(22) Filed: Aug. 4, 2022

(65) Prior Publication Data

US 2023/0024971 A1    Jan. 26, 2023

(30) Foreign Application Priority Data

Jun. 25, 2021   (CN) .......................... 202110716121.6

(51) Int. Cl.
*G11C 16/04* (2006.01)
*G11C 7/14* (2006.01)
*G11C 16/10* (2006.01)

(52) U.S. Cl.
CPC ................ *G11C 16/10* (2013.01); *G11C 7/14* (2013.01); *G11C 16/0483* (2013.01)

(58) Field of Classification Search
CPC ....... G11C 16/10; G11C 7/14; G11C 16/0483; G11C 16/08; G11C 16/32; G11C 16/3427; G11C 7/12; G11C 8/08
USPC ...................................... 365/185.01
See application file for complete search history.

(56) References Cited

U.S. PATENT DOCUMENTS

| 10,803,952 | B2* | 10/2020 | Lee ......................... H10B 41/35 |
| 2020/0152273 | A1 | 5/2020 | Lee |
| 2020/0168276 | A1* | 5/2020 | Yang ................... G11C 16/3427 |

FOREIGN PATENT DOCUMENTS

| CN | 102800361 A | 11/2012 |
| CN | 103578539 A | 2/2014 |
| CN | 105719703 A | 6/2016 |

(Continued)

*Primary Examiner* — Tha-O H Bui
(74) *Attorney, Agent, or Firm* — BAYES PLLC

(57) ABSTRACT

A memory device includes a memory cell array including memory blocks and a peripheral circuit coupled to the memory cell array. Each memory block includes memory strings each including dummy cells and select transistors, bit lines coupled to the memory strings, select lines including first select lines and second select lines, and one or more dummy word lines. Each select line coupled to the select transistors. The first select lines are closer to the bit lines than the second select lines. Each dummy word line is coupled to the respective dummy cells. The dummy word lines include a first dummy word line adjacent to either the first select lines or the second select lines. The peripheral circuit is configured to apply a turn-on voltage to all the first select lines, and apply a program voltage to the first dummy word line.

20 Claims, 9 Drawing Sheets

(56) References Cited

FOREIGN PATENT DOCUMENTS

| CN | 106157999 A | 11/2016 |
|---|---|---|
| CN | 111354401 A | 6/2020 |

* cited by examiner

MEMORY DEVICE WITH DUMMY WORD LINE, SYSTEM AND METHOD FOR PROGRAMMING THEREOF

CROSS-REFERENCES TO RELATED APPLICATIONS

This application claims the benefit of priority to Chinese Application No. 202110716121.6, filed on Jun. 25, 2021, which is incorporated herein by reference in its entirety.

BACKGROUND

The present disclosure relates to nonvolatile memory device, system, and method of operating the same.

Nonvolatile memory devices are capable of retaining data stored in them after a power failure and are widely used in computers, cellular phones, smart phones, personal digital assistants, and other electronic devices or systems. A nonvolatile memory device with three-dimensionally stacked memory cells may improve the integration of stored data.

As semiconductor processes shrink, high levels of integration exacerbate undesired coupling and interference between memory cells in nonvolatile memory devices during programming, thereby reducing data reliability. It is desired to program a selected dummy memory cell on a selected dummy word line without programming other dummy memory cells on the same dummy word line and other dummy word lines, while program disturb occurs when a program voltage is applied to a selected dummy word line, the program voltage is applied not only to the selected dummy memory cells, but also to unselected dummy memory cells along the same dummy word line.

SUMMARY

In one aspect, a memory device includes a memory cell array including memory blocks, and a peripheral circuit coupled to the memory cell array. Each memory block includes memory strings, bit lines coupled to the memory strings, select lines including one or more first select lines and one or more second select lines, and one or more dummy word lines. Each memory string includes dummy cells and select transistors. Each select line coupled to the select transistors. The one or more first select lines are closer to the bit lines than the one or more second select lines. Each dummy word line is coupled to the respective dummy cells. The one or more dummy word lines includes a first dummy word line adjacent to either the first select lines or the second select lines. The peripheral circuit is configured to apply a turn-on voltage to all the first select lines and apply a program voltage to the first dummy word line.

In some implementations, the first dummy word line is adjacent to the first select lines.

In some implementations, the first dummy word line is adjacent to the second select lines.

In some implementations, the peripheral circuit is further configured to apply a turn-off voltage to all the second select lines.

In some implementations, the peripheral circuit is further configured to apply a bias voltage to all the dummy word lines except the first dummy word line.

In some implementations, the bias voltage is less than the program voltage.

In some implementations, the peripheral circuit is further configured to apply the bias voltage to all the dummy word lines except the first dummy word line before applying the program voltage to the first dummy word line.

In some implementations, the peripheral circuit is further configured to apply a bias voltage to all the dummy word lines including the first dummy word line before applying the program voltage to the first dummy word line.

In some implementations, the peripheral circuit is further configured to apply a ground voltage to the bit lines.

In some implementations, the peripheral circuit is further configured to apply a precharge voltage to the bit lines before applying the ground voltage to the bit lines and applying the program voltage to the first dummy word line.

In some implementations, the peripheral circuit is further configured to apply a turn-on voltage to all the first select lines before applying the precharge voltage to the bit lines.

In some implementations, the select transistors include first select transistors coupled to the first select lines, and second select transistors coupled to the second select lines.

In some implementations, the program voltage is greater than the turn-on voltage.

In another aspect, a memory system includes a memory device includes a memory cell array including memory blocks, a peripheral circuit coupled to the memory cell array, and a memory controller coupled to the memory device and configured to control the memory device. Each memory block includes memory strings. Each memory string includes dummy cells and select transistors, bit lines coupled to the memory strings, one or more select lines including one or more first select lines and one or more second select lines, and one or more dummy word lines. Each select line is coupled to the select transistors. Each dummy word line is coupled to the respective dummy cells. The one or more dummy word lines includes a first dummy word line adjacent to either the first select lines or the bottom select lines. The one or more first select lines are closer to the bit lines than the one or more second select lines. The peripheral circuit is coupled to the memory cell array and configured to apply a turn-on voltage to all the first select, and apply a program voltage to the first dummy word line.

In yet another aspect, a method for programming a memory device. The memory device includes a memory cell array including memory blocks. Each memory block includes (i) memory strings, (ii) bit lines coupled to the memory strings, and (iii) select lines including one or more first select lines and one or more second select lines, and (iv) one or more dummy word lines. Each memory string includes dummy cells and select transistors. Each select line is coupled to the select transistors. Each dummy word line is coupled to the respective dummy cells. The dummy word lines include a first dummy word line adjacent to either the first select lines or the second select lines. The method includes applying a turn-on voltage to all the first select lines, and applying a program voltage to the first dummy word line.

In some implementations, the first dummy word line is adjacent to the first select lines.

In some implementations, the first dummy word line is adjacent to the second select lines.

In some implementations, the method further includes applying a turn-off voltage to all the second select lines.

In some implementations, the method further includes applying a bias voltage to all the dummy word lines except the first dummy word line, wherein the bias voltage is less than the program voltage.

In some implementations, the method further includes applying the bias voltage to all the dummy word lines except the first dummy word line before applying the program voltage to the first dummy word line.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
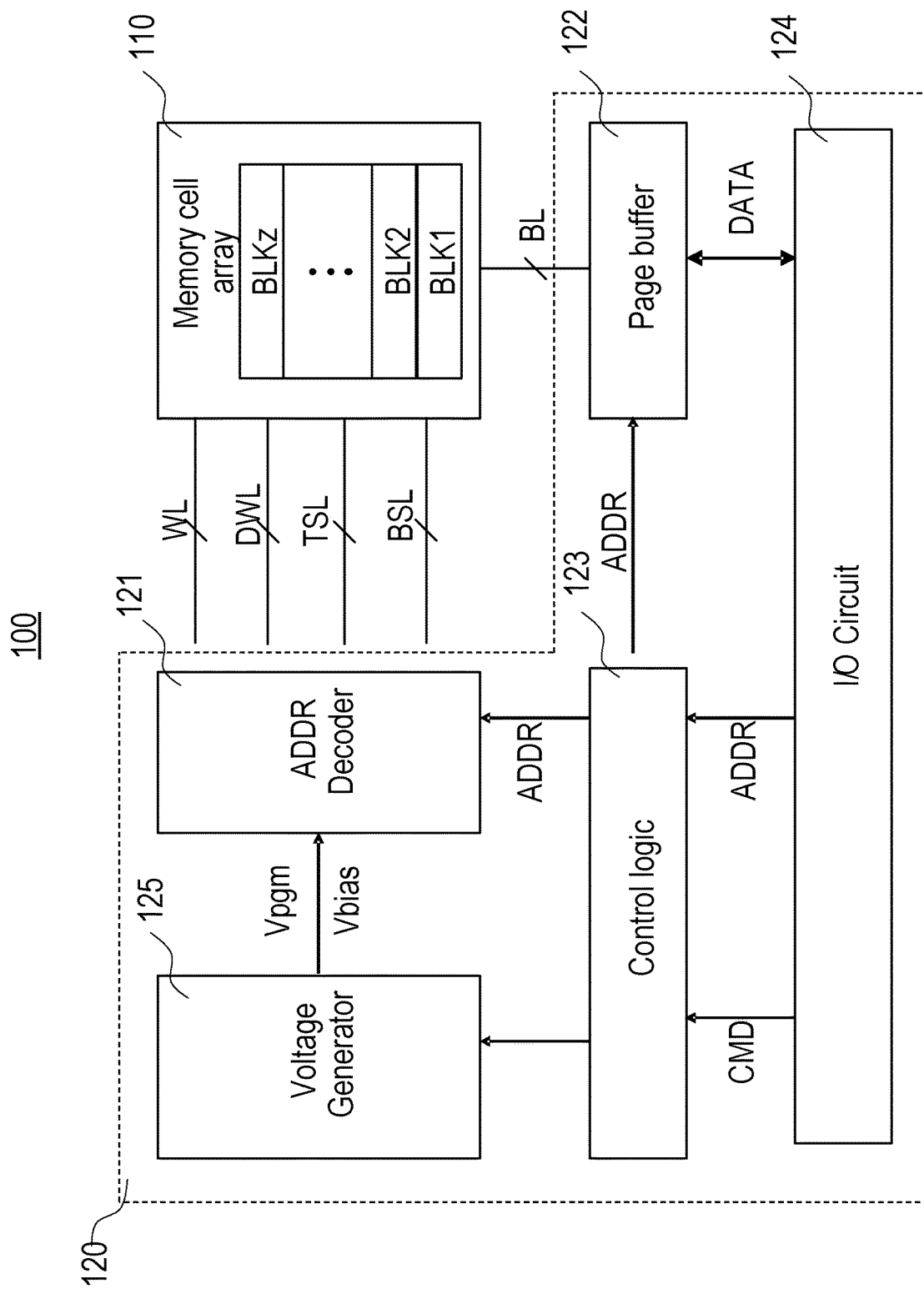
FIG. 1 is a block diagram of a nonvolatile memory device according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can be employed in a variety of other disclosures. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

With some programming methods, the threshold voltages of a plurality of unselected dummy memory cells connected to the selected dummy memory cell and the same dummy word line cannot reach an ideal distribution state, especially for the dummy memory cells close to the select transistor unit. Therefore, how to improve the program disturb problem of dummy memory cells is one of the technical problems to be solved.

FIG. 1 is a block diagram of a nonvolatile memory device 100 according to an embodiment of the present disclosure. As shown in FIG. 1, nonvolatile memory device 100 may include a memory cell array 110 and a peripheral circuit 120. The peripheral circuit 120 may include an address decoder 121, a page buffer 122, a control logic circuit 123, an input/output (I/O) circuit 124, and a voltage generator 125.

Memory cell array 110 may be connected to address decoder 121 through, for example, word lines (WL), dummy word lines (DWL), top select lines (TSL), and bottom select lines (BSL), and to page buffer 122 through, for example, bit lines (BL). Memory cell array 110 may include a plurality of memory blocks (BLK1~BLKz). Each memory block may include a plurality of pages. For example, nonvolatile memory device 100 may perform an erase operation in units of memory blocks (BLK) and perform a program operation or a read operation in units of pages. In some embodiment, the programming of dummy cells is between the erase operation and program operation of memory cells.

Address decoder 121 may control the word line (WL), the dummy word line (DWL), the top select line (TSL), and the bottom select line (BSL) connected to the memory cell array in response to control logic circuit 123. In other words, address decoder 121 can receive and decode the address (ADDR) from control logic circuit 123, and select one of the plurality of memory blocks (BLK1~BLKz) in the memory cell array 110 according to the decoded address (ADDR), and may further select one of the plurality of pages in the selected memory block. Each word line (WL) can be served to control one page. Address decoder 121 may supply the voltage required by the word line (WL) from voltage generator 125 to the selected word line (WL) in the selected memory block (BLK). For example, during a programming operation, address decoder 121 may supply a programming voltage (Vpgm) to the selected dummy word line (DWL), so that dummy memory cells corresponding to the selected dummy word line (DWL) are programmed. The programming voltage is configured to alter or switch the state of the dummy cells or memory cells.

Page buffer 122 may function as a write driver or a sense amplifier depending on the mode of operation. For example, during a programming operation, page buffer 122 may provide a bit line voltage corresponding to the data (DATA) to be programmed to the bit line (BL) of the memory cell array 110. The data (DATA) may be multi-bit data to be programmed. In a read operation, page buffer 122 may sense data stored in the selected memory cell through the bit line (BL), and output the sensed data (DATA) to I/O circuit 124. Page buffer 122 may include a plurality of page buffers connected to the bit lines (BL), respectively.

Control logic circuit 123 may control address decoder 121, page buffer 122, and voltage generator 125 in response to commands (CMD) (e.g., program commands and read commands) and addresses (ADDR) from I/O circuit 124. In addition, control logic circuit 123 may control the nonvolatile memory device 100 to perform a programming operation through a multi-step method. The multi-step method can perform programming operations multiple times to configure a desired programming state, and can include pre/main programming methods, reprogramming methods, shadow programming methods, and the like.

Voltage generator 125 may generate required voltages to be supplied to including word line (WL), dummy word line (DWL), top select line (TSL), and bottom select line (BSL) under the control of control logic circuit 123. For example, the voltage supplied to the dummy word line (DWL) may include a program voltage (Vpgm) and a bias voltage (Vbias). It is noted that the program voltage is configured to alter or switch the dummy cells or memory cells into different states, while the bias voltage is configured to turn on the dummy cells or memory cells that allows the dummy cells or memory cells to be functional during that state.

It should be understood by those skilled in the art that the operations performed by address decoder 121, page buffer 122, control logic circuit 123, and voltage generator 125 described in this disclosure may be performed by a processing circuit. The processing circuit may include, but is not limited to, hardware of a logic circuit or a hardware/software combination of a processor executing software.

The present disclosure provides a method for peripheral circuit 120 to perform a programming operation on a dummy memory cell. Specifically, peripheral circuit 120 applies the program voltage (Vpgm) to the first dummy word line adjacent to the select lines (e.g., TSL/BSL) among the plurality of dummy word lines (DWL) in the programming execution stage, so that programming operations of the dummy memory cells are performed to which the plurality of dummy word lines connected.

According to the programming method provided by the present disclosure, by programming a plurality of dummy memory cells connected to the first dummy word line during one programming operation, the connection to the same dummy word line during multiple programming operations can be avoided or improved. Due to hot electron injection (HCI) or gate-induced drain leakage (GIDL) current in the dummy memory cells, the problem of program disturbance is caused. At the same time, the threshold voltage distribution state of the programmed dummy memory cells can be better consistent. In addition, the programming time of the dummy memory cells can also be shortened, thereby improving programming efficiency.

Figure 2:
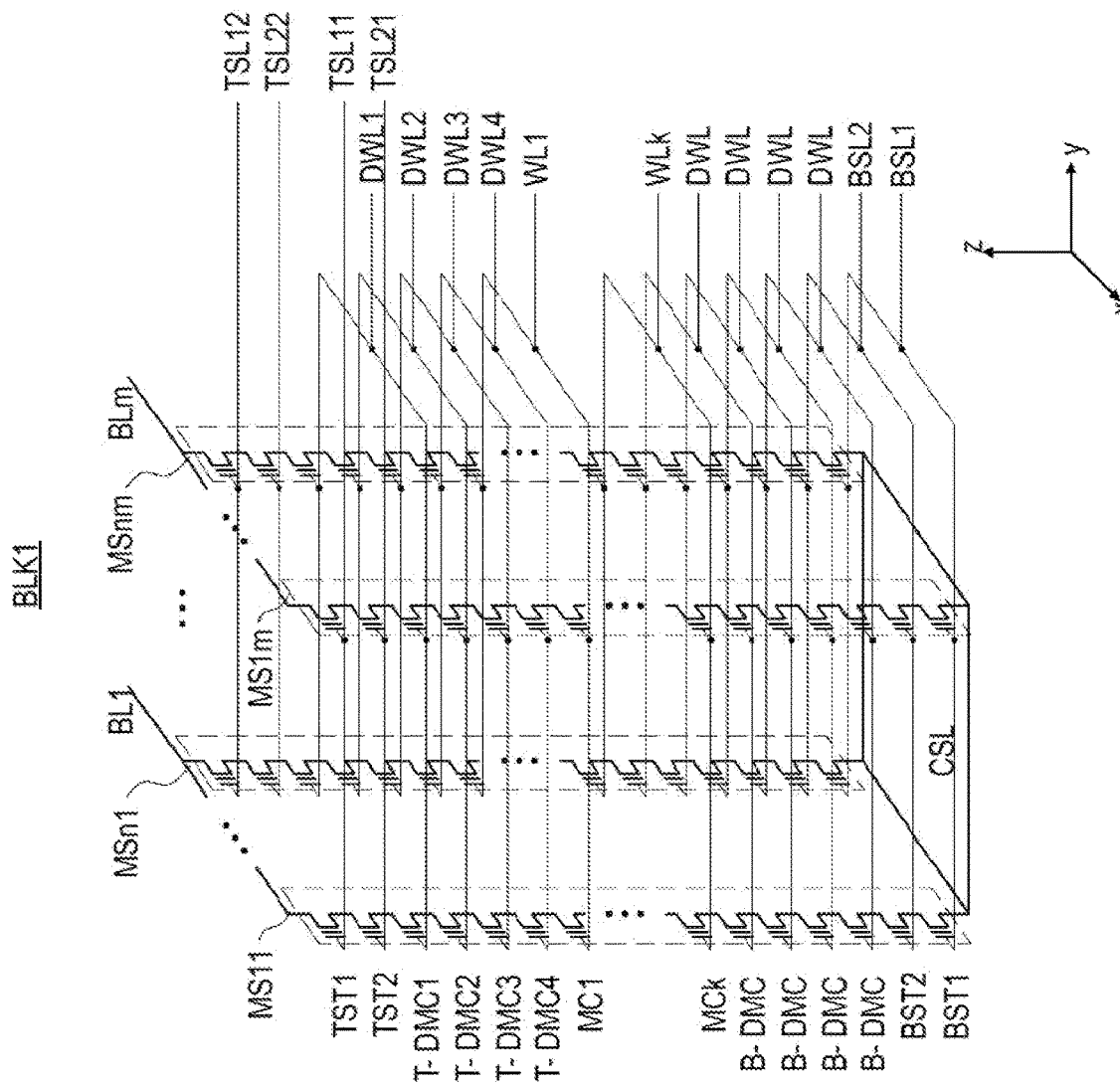
FIG. 2 is an equivalent circuit diagram of a memory block according to some implementations of the present disclosure.

FIG. 2 is an equivalent circuit diagram of a memory block (BLK1) according to an embodiment of the present disclosure. The memory block (BLK1) may be the same as or similar to the other memory blocks (BLK2—BLKz) in memory cell array 110, and thus, the present disclosure uses the memory block (BLK1) as an example to describe it in detail.

As shown in FIG. 2, the memory block (BLK1) includes a plurality of memory strings (MS11~MSnm). In some embodiments, each memory block may be separated by one or multiple gate line slits. The memory strings (MS11~MSnm) may be arranged in a two-dimensional array on the x-y plane. Each memory string (MS) may extend in the z-direction, and may sequentially include a top select transistor (TST), a top dummy memory cell (T-DMC), a memory cell (MC), a bottom dummy memory cell (B-DMC), and a bottom select transistor (BST), whose source and drain terminals are connected in series with each other. The top select transistor is configured to serve as a bit line selector to turn on and off the connection between the bit line and the memory strings. The bottom select transistor is configured to serve as a common source line selector to turn on and off the connection between the common source line and the memory strings. The number of the select transistors (TST/B ST), the dummy memory cells (T-DMC/B-DMC), and the memory cells (MC) on each memory string (MS) are not specifically limited in this disclosure. For example, in some embodiments, there may be one to three top select transistors or bottom select transistors. In some embodiments, there may be four to six dummy memory cells. The dummy memory cell (T-DMC/B-DMC) and the memory cell (MC) may be charge trapping metal— oxide— semiconductor (MOS) transistors, which can use the tunneling effect to change their threshold voltage, so that the memory cell (MC) and/or the dummy memory cell (T-DMC/B-DMC) may be in different memory states. The select transistor (TST/BST) may be a MOS transistor or a charge trapping MOS transistor, which is not specifically limited in this disclosure. In addition, since the connection method of the top dummy memory cell (T-DMC) and the bottom dummy memory cell (B-DMC) may be the same, the numbering description of the bottom dummy memory cell (B-DMC) and the corresponding structure is omitted in FIG. 2 in this disclosure.

A plurality of memory strings (MS11~MSnm) on a single memory block (e.g., BLK1) may be connected to a common source line (CSL). Specifically, the source terminals of the plurality of bottom select transistors (BST1) located at the ends of the plurality of memory strings (MS11~ MSnm) may be connected to the common source line (CSL).

A plurality of memory strings (MS11~MSnm) on the memory block (BLK1) may be connected to a common source line (CSL). Specifically, the source terminals of the plurality of bottom select transistors (BST1) located at the ends of the plurality of memory strings (MS11~ MSnm) may be connected to the common source line (CSL).

Gate terminals of memory cells (MC1~MCk) may be connected to the respective word line (WL1~WLk).

Gate terminals of top select transistors (TST, e.g., TST2) located at the same height or similar height distant from the common source line (CSL) in a plurality of memory strings (e.g., MS11 to MS1m) arranged in the y-direction may be connected to the respective top select transistor line (e.g., TSL21). Similarly, the gate terminals of the bottom select transistors (BST) located at the same height or a similar height distant from the common source line (CSL) in the plurality of memory strings (e.g., MS11 to MS1m) arranged in the y-direction may be connected to the same bottom select line (BSL). Alternatively, as shown in FIG. 2, a plurality of bottom select lines (BSL) located at the same height or a similar height from the common source line (CSL) may be connected to each other. In other words, similar to the word line (WL) and the dummy word line (DWL), the gate terminals of the bottom transistors (BST, e.g., BST2) located at the same or similar heights distant from the common source line (CSL) in the plurality of memory strings (MS11~MSnm) may be connected to the same bottom select line (BSL2).

A plurality of memory strings (MS11~MSnm) on the memory block (BLK1) may be connected to a plurality of bit lines (BL1~BLm). Specifically, among the plurality of memory strings (e.g., MS11 to MSn1) arranged in the x-direction, the drain terminals of the top select transistors (TST1) located at the same height or similar height distant from the common source line (CSL) and located at the ends may be connected to the same bit line (BL1).

According to the structure described above, the extending direction of the bit line (BL) and the extending direction of the top select line (TSL) may be perpendicular to each other.

Figure 3:
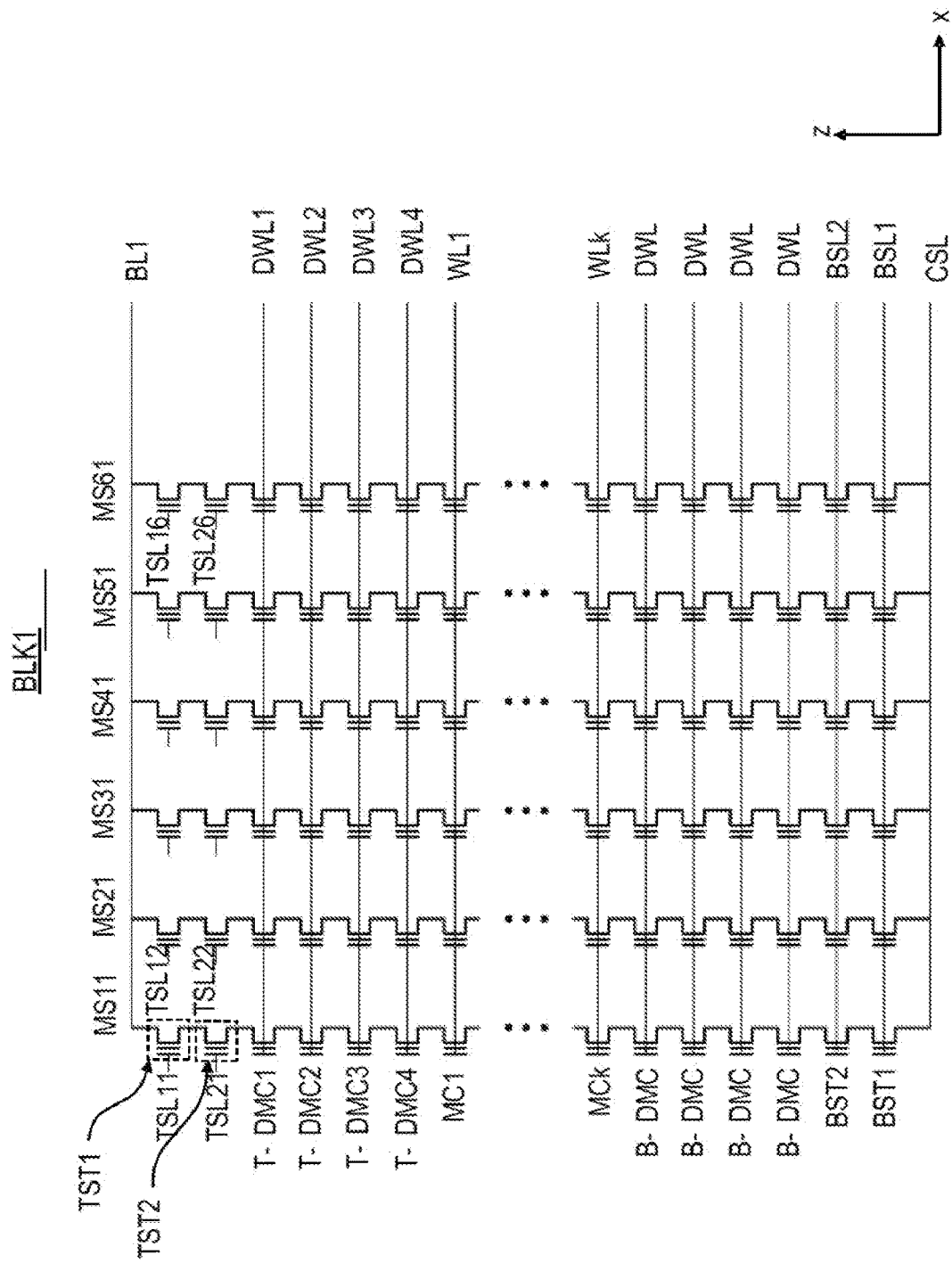
FIG. 3 is an equivalent circuit diagram of a portion of the memory block shown in FIG. 2.

FIG. 3 is an equivalent circuit diagram of a part of the memory block (BLK1) shown in FIG. 2. FIG. 3 shows a plurality of strings (MS11~MS61) connected to the same bit line (BL1). The gate terminals of the top select transistors (TST2) in the memory strings (MS11~MS61) may be respectively connected to the top select lines (TSL21~TSL26), and the gate terminals of the top select transistors (TST1) in the memory strings (MS21—MS61) may be respectively connected to the top select lines (TSL11—TSL16). The programming operation performed by the dummy memory cells (T-DMC1) in the memory strings (MS11~MS61) near the top select transistors TST2 (e.g., top select lines TSL21—TSL26) will be described in detail below with reference to the accompanying drawings.

Figure 4:
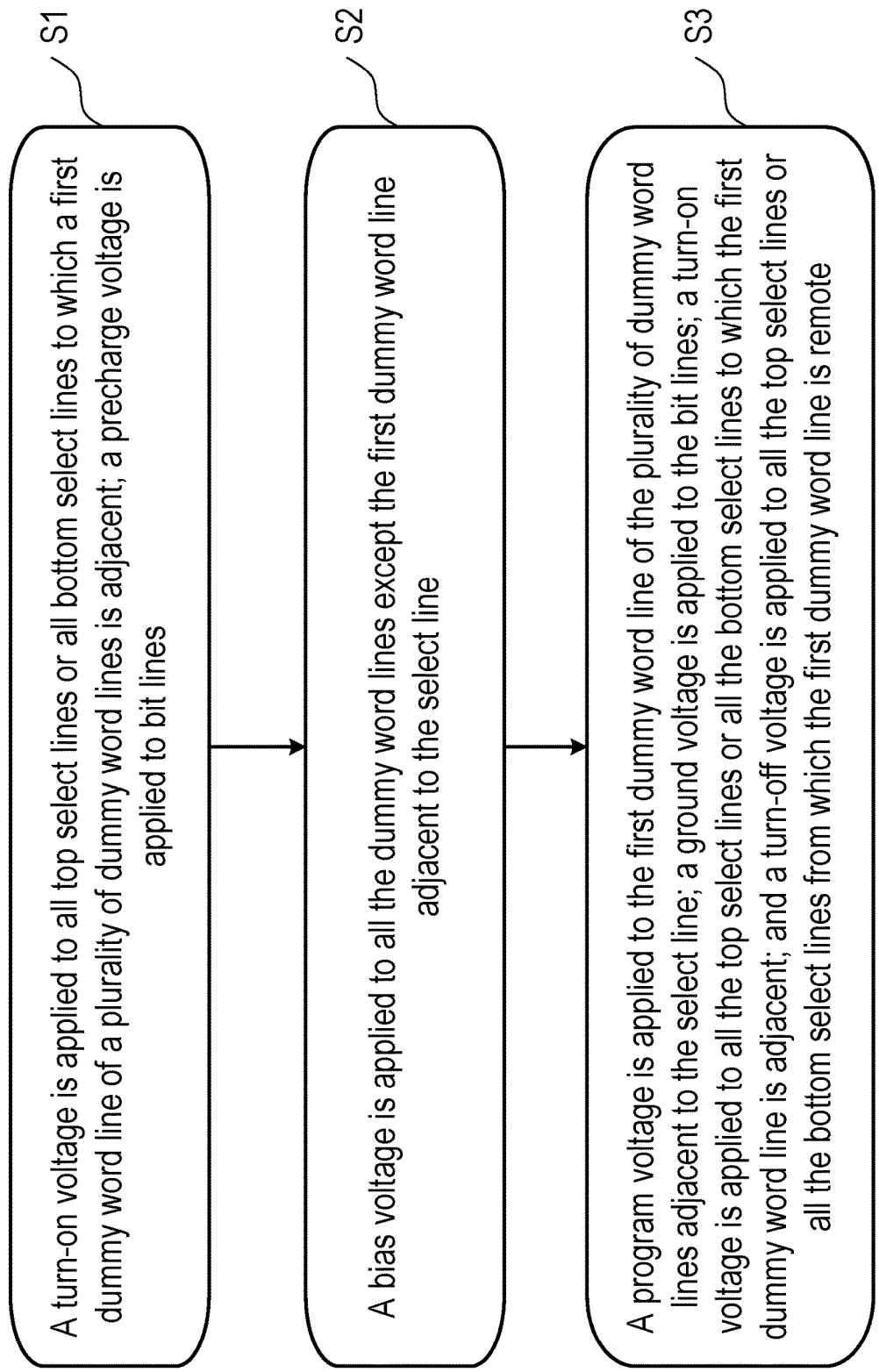
FIG. 4 is a flowchart of an operating method of a nonvolatile memory device according to some implementations of the present disclosure.

FIG. 4 is a flowchart of a programming method of a nonvolatile memory device according to an embodiment of the present disclosure. As shown in FIG. 4, a programming method 400 provided by the embodiment of the present disclosure program a plurality of dummy memory cells connected to the same dummy word line in a single programming process, thereby avoiding the programming interference caused by HCI or GIDL current between dummy memory cells connected to dummy word lines when multiple programming operations are performed. Unlike a conventional programming method, the programming method 400 may program the dummy word lines closed to the top select lines of all the memory strings in the same block in a single programming process. By programming all the dummy word lines closed to the top select line in the same block in a single programming process rather than sequentially programming the dummy word lines string by string, the program disturbs of the dummy word lines closed to the top select line can be avoided.

As shown in FIG. 4, during the programming preparation stage, method 400 includes applying a turn-on voltage to all top select lines or all bottom select lines to which a first dummy word line of a plurality of dummy word lines is adjacent, and also applying a precharge voltage is applied to bit lines at operation 402. In some embodiments, applying a precharge voltage to bit lines may be before, after, or at the same time as applying the turn-on voltage to all the top select lines or all the bottom select lines to which the first dummy word line is adjacent. The ground voltage (Vss) may be applied to the first dummy word lines (DWL1) and second dummy word lines (DWL2~DWL4), and a cut-off voltage such as the ground voltage (Vss) may be applied to the bottom select lines (BSL1) and (BSL2). It is noted that the turn-on voltage is configured to turn on the gate terminals of the top select transistors (e.g., TST2) in the memory strings (MS11~MS61) connected to the corresponding top select lines, or the gate terminals of the bottom select transistors (e.g., BST2) in the memory strings (MS11~MS61) connected to the corresponding bottom select lines. It is also noted that the cut-off (e.g., turn-off) voltage is configured to turn off the gate terminals of the top select transistors (e.g., TST2) in the memory strings (MS11~MS61) connected to the corresponding top select lines, or the gate terminals of the bottom select transistors (e.g., BST2) in the memory strings (MS11~MS61) connected to the corresponding bottom select lines.

Next, method 400 may further include applying a bias voltage to all the dummy word lines except the first dummy word line adjacent to the select line at operation 404. In some embodiments, the bias voltage can also be applied to all the dummy word lines including the first dummy word line adjacent to the select line.

Next, during the programming execution stage, method 400 may further include applying a program voltage to the first dummy word line of the plurality of dummy word lines adjacent to the select line, applying a ground voltage to the bit lines, applying a turn-on voltage to all the top select lines or all the bottom select lines to which the first dummy word line is adjacent, and applying a turn-off voltage to all the top select lines or all the bottom select lines from which the first dummy word line is remote at operation 406. In some embodiments, the bias voltage is less than the program voltage.

Figure 5A:
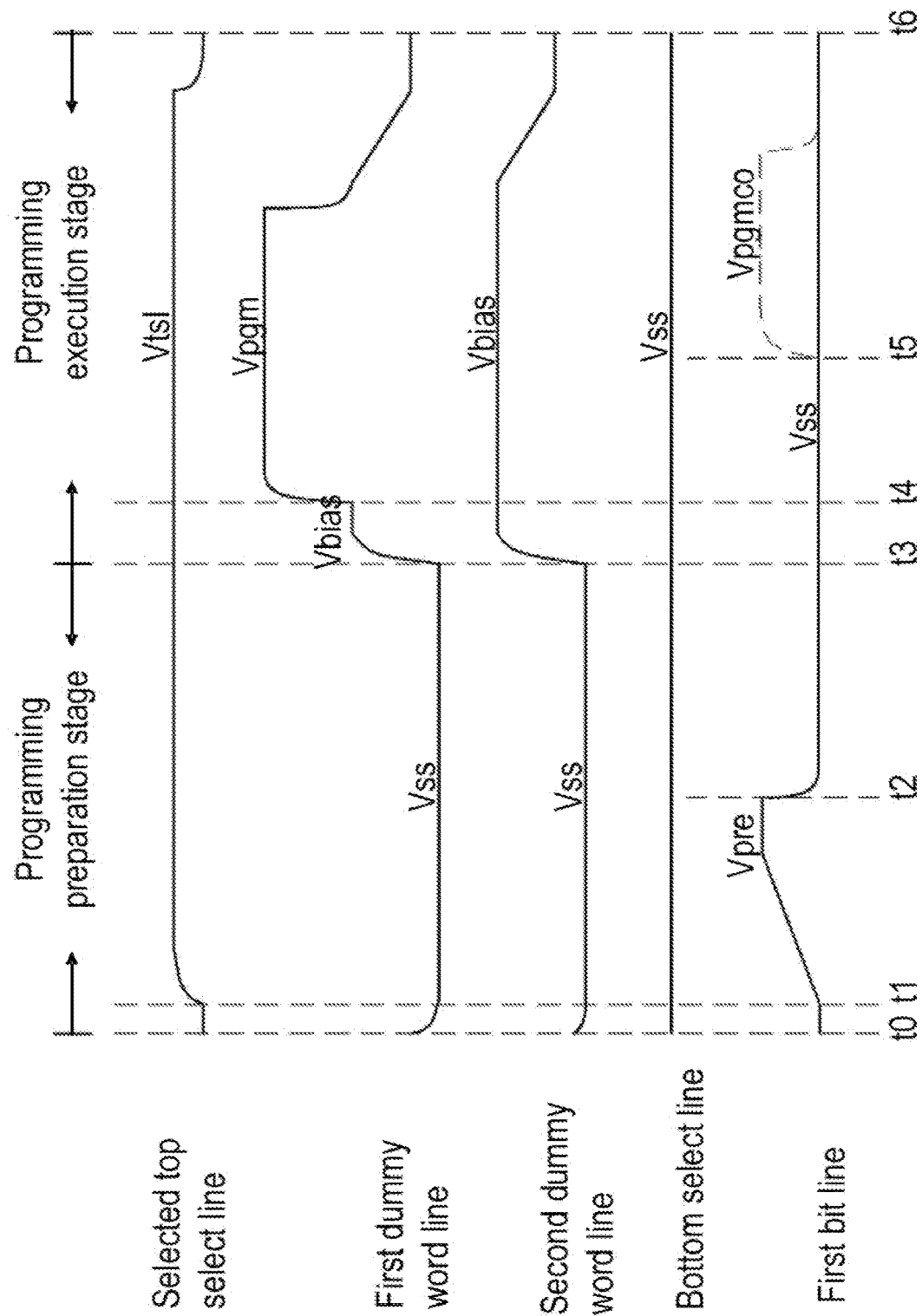
FIG. 5A is a voltage waveform diagram of an operating method of a nonvolatile memory device according to some implementations of the present disclosure.

FIG. 5A is a voltage waveform diagram of the programming method 400 of a nonvolatile memory device according to an embodiment of the present disclosure. The programming operation voltage waveform diagram shown in FIG. 5A may be performed by a portion of the nonvolatile memory device 100 shown in FIG. 3.

When the dummy memory cells (T-DMC1) in the memory strings (MS11 to MS61) are served as dummy memory cells to be programmed, the top select lines (TSL21 to TSL26) corresponding to the top select transistors (TST2), and the top select lines (TSL11 to TSL16) corresponding to the top select transistors (TST1), can be selected as top select lines. The dummy word line (DWL1) corresponding to the dummy transistor (T-DMC1) can be served as the first dummy word line. During the programming execution stage, all the top select transistors in the same block are turned on and all the corresponding dummy memory cells will be programmed. The dummy word lines (DWL2~DWL4) corresponding to the dummy transistors (T-DMC2—T-DMC4) can be served as the second dummy word lines. The bottom select line (BSL2) corresponding to the bottom select transistor (BST2), and the bottom select line (BSL1) corresponding to the bottom select transistor (BST1), can be served as the bottom select line. The bit line (BL1) can be served as the first bit line.

At the time node t0 of the programming preparation stage, the selected top select lines (TSL21—TSL26) and (TSL11—TSL16), the first dummy word line (DWL1), the second dummy word line (DWL2—DWL4), and the bottom select lines (BSL1 and BSL2) are in their respective the reference voltage state. The ground voltage (Vss) may be applied to the first dummy word lines (DWL1) and second dummy word lines (DWL2~DWL4), and a cut-off voltage such as the ground voltage (Vss) may be applied to the bottom select lines (BSL1) and (BSL2). The selected top select lines (TSL21~TSL26) and (TSL11~TSL16) and the first bit line (BL1) may hold the reference voltage.

At the time node t1 of the programming preparatory stage, a turn-on voltage (Vtsl) may be applied to the selected top select lines (TSL21-TSL26) and (TSL11-TSL16), and the turn-on voltage (Vtsl) may be, for example, 2.8 V. Meanwhile, the precharge voltage (Vpre) may be applied to the first bit line (BL1). The first dummy word line (DWL1), the second dummy word lines (DWL2—DWL4), and the bottom select lines (BSL1) and (BSL2) may be held at the ground voltage (Vss).

Under the above voltage conditions, the top select transistors (TST1) and (TST2) may be in an on-state, thereby electrically connecting the top select transistors (TST1) and (TST2) with the first bit line (BL1). The bottom select transistors (BST1) and (BST2) may be in an off-state, so that the memory strings (MS11~MS61), where the top select transistors (TST1) and (TST2) or the bottom select transistors (BST1) and (BST2) are located, are in a floating state. In other words, the memory strings (MS11~MS61) to be programmed where the dummy memory cells (T-DMC1) are located can be in a floating state. Also, when the first bit line (BL1) is applied to the precharge voltage (Vpre), it is possible to reduce the introduction of carriers from the first bit line (BL1) to the memory strings (MS11~MS61).

At the time node t2 of the programming preparation stage, the ground voltage (Vss) may be applied to the first bit line (BL1). The selected top select lines (TSL21—TSL26) and (TSL11~TSL16), the first dummy word (DWL1), the second dummy word lines (DWL2—DWL4), and the bottom select lines (BSL1) and (BSL2) may be held in their respective voltages.

At the time node t3 of the programming execution stage, the bias voltage (Vbias) may be applied to the first dummy word line (DWL1) and the second dummy word lines (DWL2~DWL4), and the bias voltage (Vbias) may be, for example, 9 V. The selected top select lines (TSL21~TSL26) and (TSL11~TSL16), the bottom select lines (BSL1) and (BSL2), and the first bit line (BL1) may be held in their respective voltages.

At the time node t4 of the programming execution stage, the program voltage (Vpgm) may be applied to the first dummy word line (DWL1), and the program voltage (Vpgm) may be, for example, 15 V. The selected top select lines (TSL21—TSL26) and (TSL11—TSL16), the second dummy word lines (DWL2~DWL4), the bottom select lines (BSL1) and (BSL2), and the first bit line (BL1) may be held in their respective voltages.

Under the above voltage conditions, since the top select transistors (TST1) and (TST2) in the memory strings (MS11~MS61) are both in the on-state, the memory strings (MS11~MS61) can be electrically connected to the first bit line (BL1). At the same time, under the condition that the first dummy word line (DWL1) is applied with the program voltage (Vpgm), the dummy memory cells (T-DMC1) in the memory strings (MS11~MS61) connected to the first dummy word line (DWL1) can be programmed in this programming process. Therefore, the distribution state of the threshold voltage (Vth) of the programmed dummy memory cells (T-DMC1) in the memory strings (MS11~ MS61) has a better consistency. In addition, when the first dummy word lines (DWL1) in the memory strings (MS11~MS61) are applied as the program voltage (Vpgm), the second dummy word lines (DWL2~DWL4) in the memory strings (MS11~MS61) are applied as the bias voltage (Vbias), thereby avoiding programming disturb caused by the plurality of dummy memory cells (T-DMC2—T-DMC4) connected to the second dummy word lines (DWL2—DWL4) in the memory strings (MS11~MS61).

In some embodiments, at time node t5 of the programming execution stage, the program cut-off voltage (Vpgmco) may be applied to all the bit lines, including the first bit line (BL1). The program cut-off voltage (Vpgmco) may be applied to the dummy memory cell (T-DMC1) to stop the programming process when the dummy memory cell (T-DMC1) reaches a predetermined memory state. In some embodiments, at time node t5 of the programming execution stage, the program cut-off voltage (Vpgmco) may be applied to only parts of the bit lines, for instance, the program cut-off voltage (Vpgmco) may be applied to those bit lines connected to programmed memory cells, while the program cut-off voltage (Vpgmco) may not be applied to those bit lines connected to unprogrammed memory cells such that these unprogrammed memory cells may continue their programming process. In the programming execution stage, when the dummy memory cells (T-DMC1) in the memory strings (MS11~MS61) reach a predetermined memory state, the selected top select lines (TSL21-TSL26) and (TSL11-TSL16), the first dummy word line (DWL1), the second dummy word lines (DWL2—DWL4), the bottom select lines (BSL1) and (BSL2), and the first bit line (BL1) may turn to their respective reference voltages at time node t6.

Figure 5B:
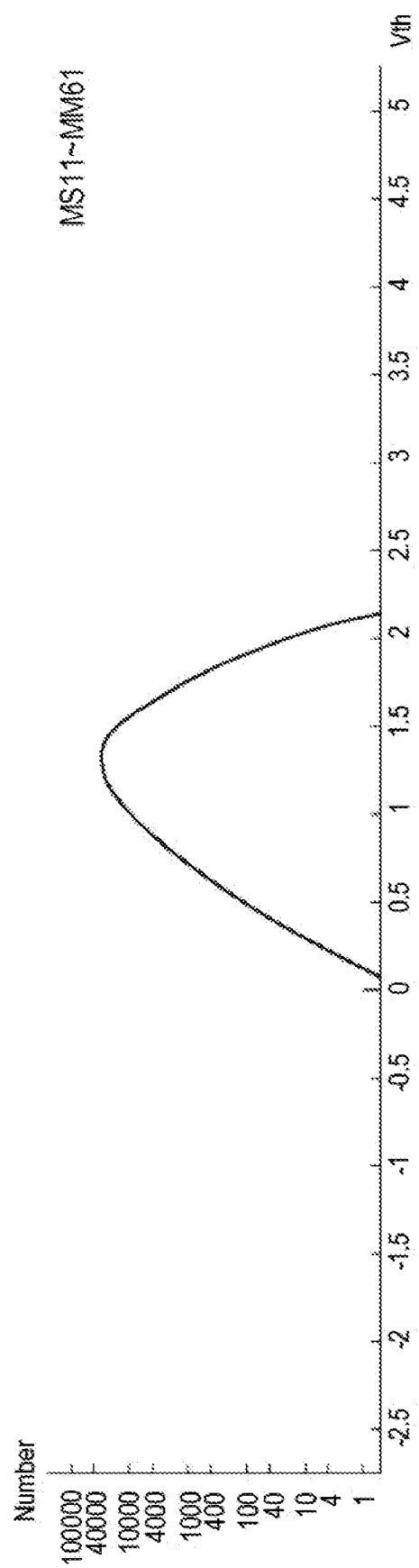
FIG. 5B is a threshold voltage distribution diagram of a dummy memory cell after a programming operation using some implementations of the present disclosure.

FIG. 5B is a distribution diagram of the threshold voltage Vth of the dummy memory cell after the programming method 400 of the embodiment of the present disclosure is adopted. As shown in FIG. 5B, by using the programming method 400 of the embodiment of the present disclosure, the distribution of the threshold voltage Vth of the dummy memory cell (T-DMC1) near the top select transistor (TST2) in the memory strings (MS11~ MS61) can be more consistent, which is beneficial to control of the dummy memory cells (T-DMC1) in memory strings (MS11~MS61).

Figure 6A:
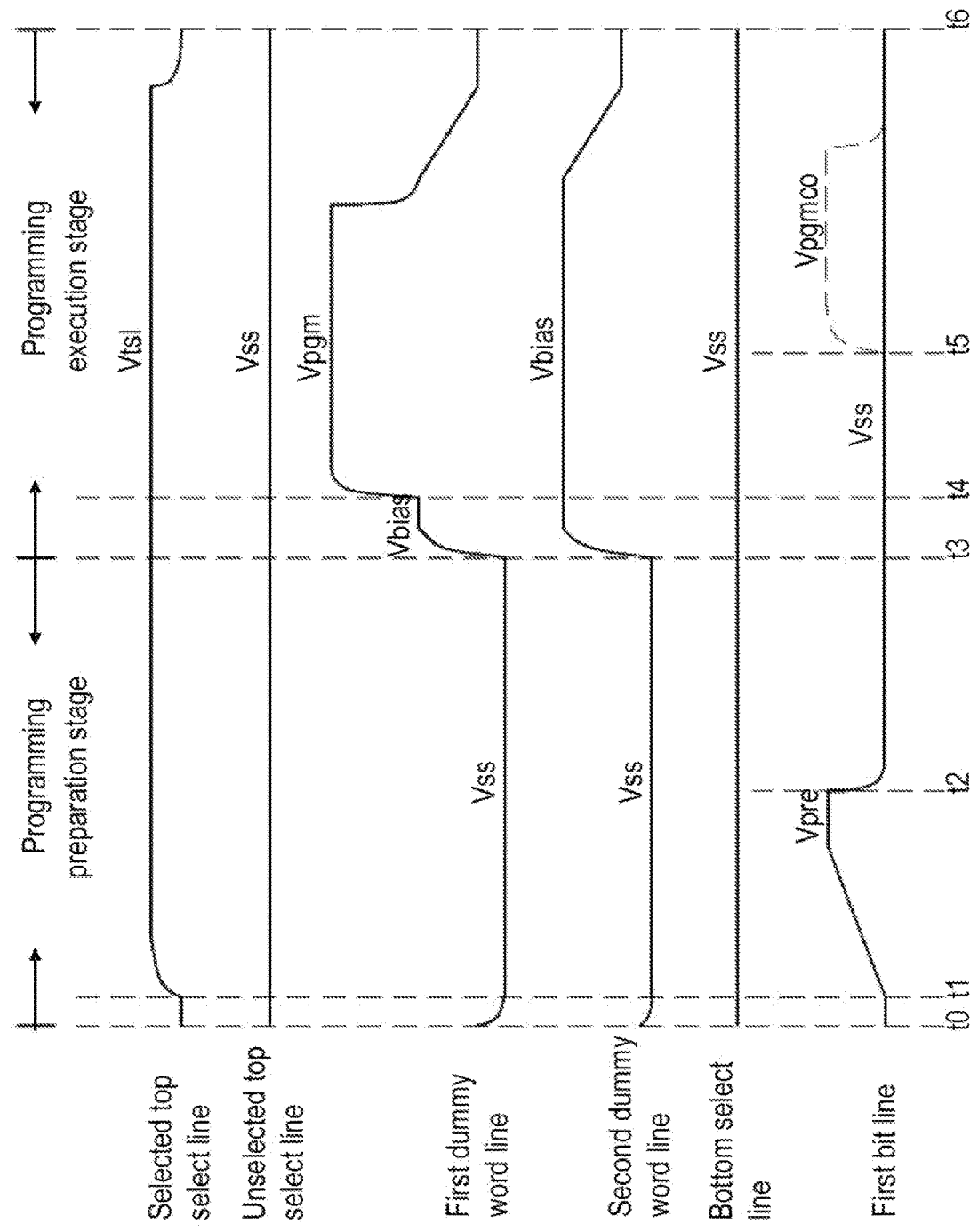
FIG. 6A is a voltage waveform diagram of a programming method of a nonvolatile memory device.
Figure 6B:
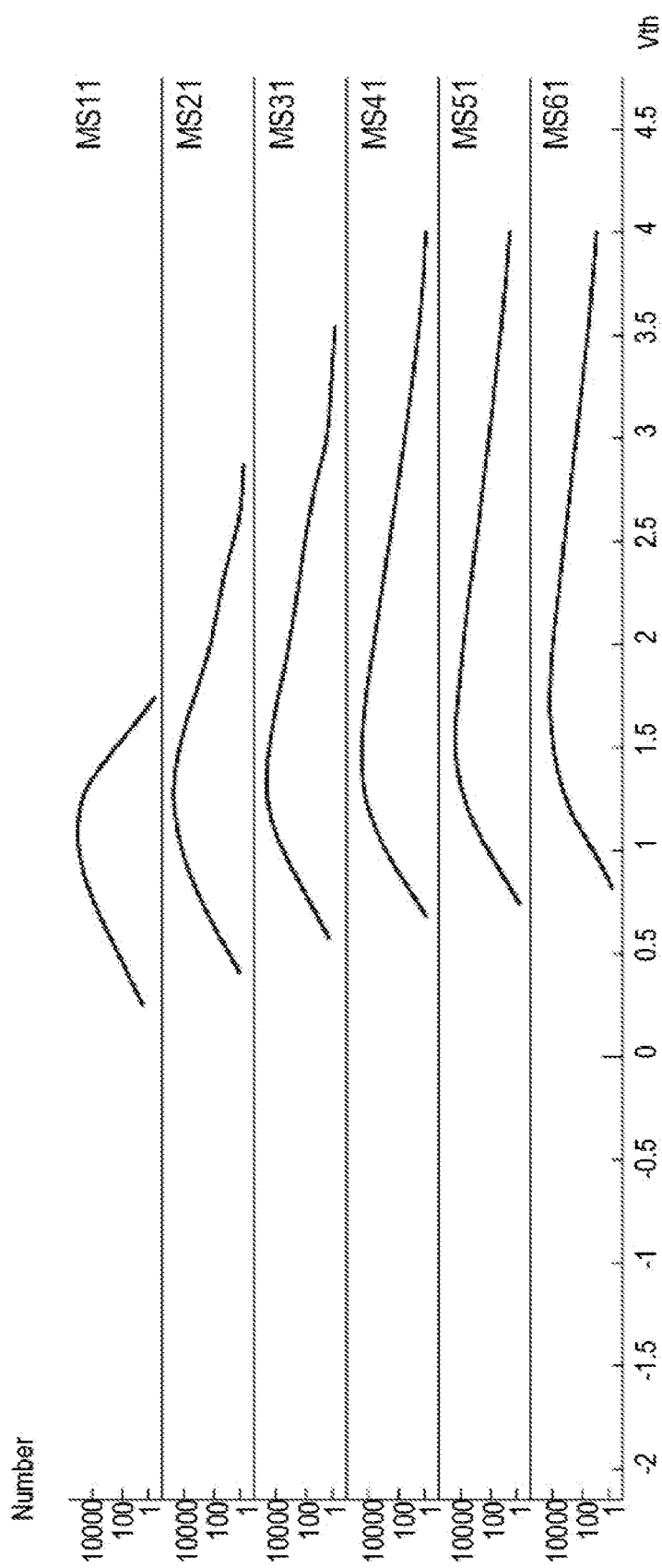
FIG. 6B is a graph of the distribution of threshold voltages of dummy memory cells after adopting a programming method.

FIG. 6A is a voltage waveform diagram of a programming method of a nonvolatile memory device. FIG. 6B is a distribution diagram of the threshold voltage Vth of the dummy memory cell after using the conventional programming method. The difference between the conventional programming method and the programming method 400 of the embodiment of the present disclosure is that the conventional programming method is realized by sequentially performing programming operations on the dummy memory cells (T-DMC1) closed to the top select line in each selected memory strings (MS11~MS61), while the programming method 400 is realized by performing programming operations on the dummy memory cells (T-DMC1) closed to the top select line in all the memory strings (MS11~MS61) in a block.

Specifically, when a programming operation is performed for the first time, the dummy memory cell (T-DMC1) in the memory string (MS11) serves as the dummy memory cell to be programmed and also serves as the selected dummy memory cell. Correspondingly, the top select line (TSL21) corresponding to the top select transistor (TST2) and the top select line (TSL22) corresponding to the top select transistor (TST1) in the memory string (MS11) can be served as the top select line for selection. The top select lines (TSL22 to TSL26) corresponding to the top select transistors (TST2) in the memory strings (MS21 to MS61) and the top select lines (TSL12 to TSL16) corresponding to the top select transistors (TST1) can be served as unselected top select lines. The dummy word line (DWL1) corresponding to the dummy transistor (T-DMC1) in the memory string (MS11) can be served as the first dummy word line. The dummy word line transistors (DWL2—DWL4) corresponding to the dummy transistors (T-DMC1~T-DMC4) in the memory string (MS11) can be served as the second dummy word line. The bottom select line (BSL2) corresponding to the bottom select transistor (BST2) in the memory string (MS11) and the bottom select line (BSL1) corresponding to the bottom select transistor (BST1) can be served as the bottom select line. The bit line (BL1) can be served as the first bit line.

As shown in FIG. 6A, when a programming operation is performed on the dummy memory cells (T-DMC1) in the memory string (MS11), at the time node t0 of the programming preparatory stage, a cut-off voltage such as the ground voltage (Vss) is applied to the unselected top select lines (TSL22~TSL26) and (TSL12~TSL16), and the unselected top select lines (TSL22~TSL26) and (TSL12~TSL16) stay in the ground voltage (Vss) in the programming preparation stage and the programming execution stage until in the time node t6 of the programming execution stage and then returns to their corresponding reference voltages. The voltage conditions of the top select line, the first dummy word line, the second dummy word line, the bottom select line, and the first bit line in the conventional programming method are the same or similar to the programming method 400 according to the embodiments of the present disclosure during the programming execution stage and the programming preparation stage, which is not repeated in this disclosure.

Under the above voltage conditions, the top select transistors (TST2 and TST1) in the memory strings (MS11) corresponding to the selected top select lines (TSL21 and TSL11) are in the on-state, so that the memory strings (MS11) can be electrically connected to the first bit line (BL1). Meanwhile, under the condition that the first dummy word line (DWL1) applies the programming voltage (Vpgm), the dummy memory cells (T-DMC1) in the memory string (MS11) are programmed. However, although the unselected top select lines (TSL22~TSL26) and (TSL12—TSL16) correspond to the top select transistors (TST2 and TST1) of the memory strings (MS21~MS61) are in off-state, the dummy memory cells (T-DMC1) located in the memory strings (MS21~MS61) and connected to the first dummy word line (DWL1) will cause the dummy memory cell (T-DMC1) in the memory strings (MS21~MS61) to fail due to the programming disturb caused by the influence of the HCI and GIDL currents.

Further, the dummy memory cells (T-DMC1) in the memory strings (MS11~MS61) are programmed due to multiple programming operations. Each time a programming operation is performed on the selected dummy memory cell (T-DWC1), the unselected dummy memory cell (T-DWC1) will be disturbed by the programming, so that the dummy memory cells (T-DWC1) in the memory strings (MS11~MS61) are all executed. After the programming operation, the threshold voltages Vth of the dummy memory cells (T-DWC1) in the memory strings (MS11 to MS61) exhibit an inconsistent distribution state (as shown in FIG. 6B), which is detrimental to the control of the programmed dummy memory cells (T-DWC1). In addition, conventional programming methods may be slow to program. Therefore, as described above, the programming method 400 according to the embodiments of the present disclosure can solve the above-mentioned technical problems in the conventional programming method.

It should be understood by those skilled in the art that although the embodiments of the present disclosure describe in detail, the programming method for the dummy memory cell adjacent to the top select transistor and the voltage conditions for performing the programming method are not limited to the embodiments of the present disclosure. For example, when a plurality of bottom select transistors arranged in the y-direction are connected to independent bottom select lines, the programming method according to the embodiments of the present disclosure can perform a plurality of dummy memory cells adjacent to the bottom select transistors during a programming operation.

In addition, the voltage conditions of programming the multiple dummy memory cells adjacent to the select line during the programming operation are not limited to the embodiments of the present disclosure. That is, the bottom select transistor can also be turned on, and the top select transistor can be turned off, so that the memory string is electrically connected to the common source line near the bottom select transistor.

Figure 7:
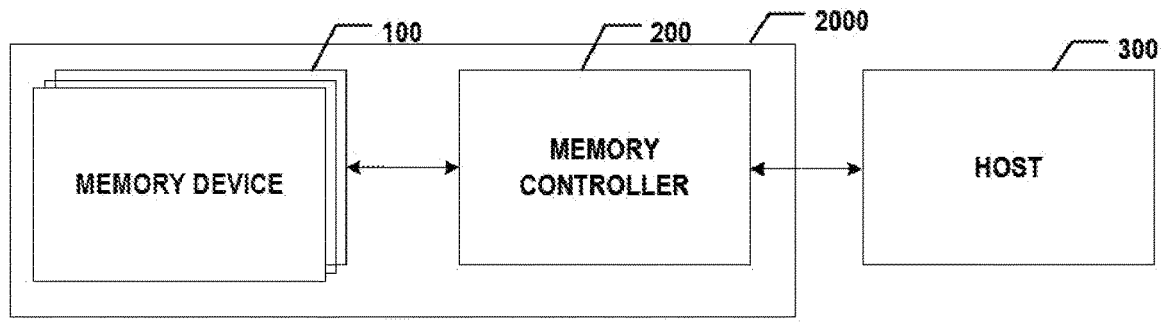
FIG. 7 is a block diagram of a memory system according to some implementations of the present disclosure.

FIG. 7 is a block diagram of a nonvolatile memory system 702 according to an embodiment of the present disclosure. As shown in FIG. 7, a nonvolatile memory system 702 includes nonvolatile memory device 100 and a memory controller 704.

Nonvolatile memory device 100 may be the same as the nonvolatile memory device described in any of the above embodiments, which will not be repeated in this disclosure.

Memory controller 704 may control nonvolatile memory device 100 through the channel (CH), and nonvolatile memory device 100 may perform operations based on the control of memory controller 704 in response to a request from a host 706. Nonvolatile memory device 100 may receive the command (CMD) and the address (ADDR) from memory controller 704 through the channel (CH) and access an area selected from the memory cell array in response to the address. In other words, nonvolatile memory device 100 may perform an internal operation corresponding to the command on the area selected by the address. More specifically, memory controller 704 is configured to send a command to execute the programming method 400 described in any of the above embodiments and the address (ADDR) through the channel (CH), so that nonvolatile memory device 100 may execute the programming method 400. Host 706 can be a processor of an electronic device, such as a central processing unit (CPU), or a system-on-chip (SoC), such as an application processor (AP). Host 706 can be configured to send or receive the data to or from nonvolatile memory device 100.

Figures 8A, 8B:
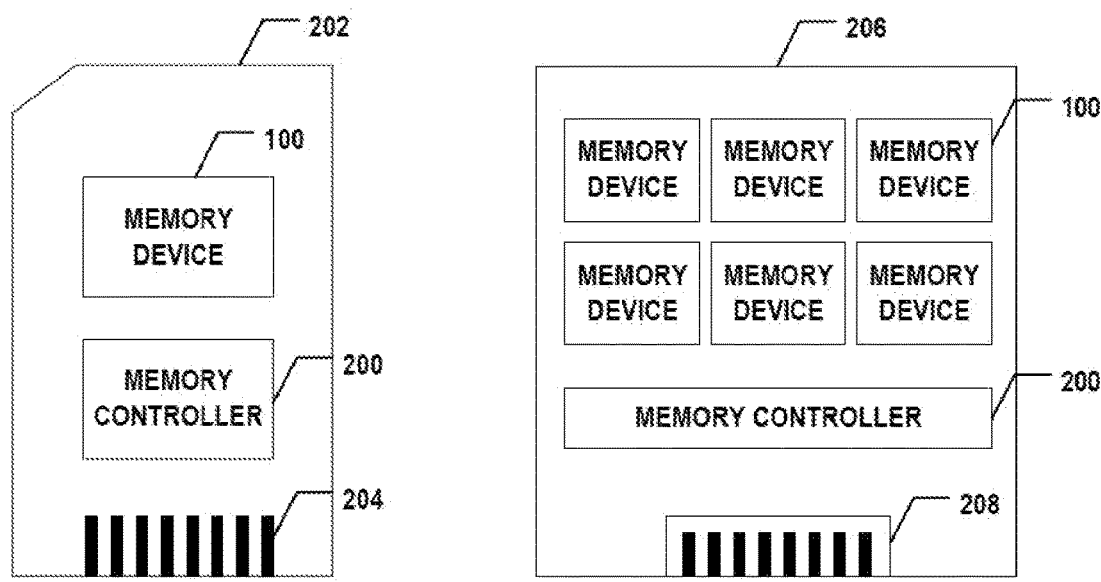
FIG. 8A illustrates a diagram of an exemplary memory card having a nonvolatile memory device, according to some implementations of the present disclosure.
FIG. 8B illustrates a diagram of an exemplary solid-state drive (SSD) having a nonvolatile memory device, according to some implementations of the present disclosure.

Memory controller 704 and one or more nonvolatile memory devices 100 can be integrated into various types of storage devices, for example, be included in the same package, such as a universal Flash storage (UFS) package or an eMMC package. That is, nonvolatile memory system 702 can be implemented and packaged into different types of end electronic products. In one example as shown in FIG. 8A, memory controller 704 and a single memory device 100 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 coupling memory card 802 with a host (e.g., host 706 in FIG. 7). In another example as shown in FIG. 8B, memory controller 704 and multiple memory devices 100 may be integrated into an SSD 806. SSD 806 can further include an SSD connector 808 coupling SSD 806 with a host (e.g., host 706 in FIG. 7). In some implementations, the storage capacity and/or the operation speed of SSD 806 is greater than those of memory card 802.

The above description is only a preferred embodiment of the disclosure and an illustration of the applied technical principle. Those skilled in the art should understand that the scope of the invention involved in this disclosure is not limited to the technical solution formed by the specific combination of the above technical features, and should also cover the above technical features without departing from the inventive concept. Other technical solutions formed by any combination of its equivalent features. For example, a technical solution is formed by replacing the above-mentioned features with the technical features disclosed in this disclosure (but not limited to) with similar functions.

What is claimed is:

1. A memory device, comprising:
   a memory cell array comprising memory blocks, each memory block comprising:
      memory strings, each memory string comprising dummy cells and select transistors;
      bit lines coupled to the memory strings;
      select lines, each select line coupled to the select transistors; and
      one or more dummy word lines, each dummy word line coupled to the respective dummy cells,
      wherein the memory blocks comprise a first memory block, the selected lines in the first memory block comprises one or more first select lines and one or more second select lines,
      the one or more first select lines are closer to the bit lines than the one or more second select lines, the one or more dummy word lines in the first memory block comprises a first dummy word line adjacent to either the one or more first select lines or the one or more second select lines, and a second dummy word line, wherein the one or more dummy word lines are between the one or more first select lines and the one or more second select lines; and
   a peripheral circuit coupled to the memory cell array, configured to:
      apply a turn-on voltage to the one or more first select lines in the first memory block during a first time period;
      apply a bias voltage to the second dummy word line during a second time period; and
      apply a program voltage to the first dummy word line during a third time period,
      wherein the first time period comprises the third time period, and the second time period comprises the third time period.

2. The memory device of claim 1, wherein the first dummy word line is adjacent to the one or more first select lines.

3. The memory device of claim 2, wherein the peripheral circuit is further configured to:
   apply a turn-off voltage to one or more second select lines at least during the second time period.

4. The memory device of claim 1, wherein the first dummy word line is adjacent to the one or more second select lines.

5. The memory device of claim 1, wherein the bias voltage is less than the program voltage.

6. The memory device of claim 1, wherein the peripheral circuit is further configured to:
   apply the bias voltage to the first dummy word line during a fourth time period, wherein the second time period comprises the fourth time period.

7. The memory device of claim 1, wherein the peripheral circuit is further configured to:
apply a ground voltage to the bit lines during a fifth time period, wherein the fifth time period comprises the second time period.

8. The memory device of claim 7, wherein the peripheral circuit is further configured to:
   apply a precharge voltage to the bit lines during a sixth time period, wherein the sixth time period is before the third time period.

9. The memory device of claim 8, wherein the peripheral circuit is further configured to:
   apply the turn-on voltage to the one or more first select lines during a seventh time period, wherein the seventh time period comprises the sixth time period.

10. The memory device of claim 1, wherein the select transistors comprises:
    first select transistors located at the same height distant from a common source line, wherein gate terminals of the first select transistors in each of the memory strings are coupled to the corresponding one or more first select lines; and
    second select transistors located at the same height distant from the common source line, wherein gate terminals of the second select transistors in each of the memory strings are coupled to one of the one or more second select lines.

11. The memory device of claim 1, wherein the program voltage is greater than the turn-on voltage.

12. A memory system, comprising:
    a memory device comprising:
       a memory cell array comprising memory blocks, each memory block comprising:
          memory strings, each memory string comprising dummy cells and select transistors;
          bit lines coupled to the memory strings;
          one or more select lines, each select line coupled to the select transistors; and
          one or more dummy word lines, each dummy word line coupled to the respective dummy cells,
          wherein the memory blocks comprise a first memory block, the selected lines in the first memory block comprises one or more first select lines and one or more second select lines, and
          the one or more dummy word lines in the first memory block comprises a first dummy word line adjacent to either the one or more first select lines or the one or more second select lines, and a second dummy word line, wherein the one or more first select lines are closer to the bit lines than the one or more second select lines, wherein the one or more dummy word lines are between the one or more first select lines and the one or more second select lines; and
       a peripheral circuit coupled to the memory cell array, configured to:
          apply a turn-on voltage to the one or more first select lines in the first memory block during a first time period;
          apply a bias voltage to the second dummy word line during a second time period; and
          apply a program voltage to the first dummy word line during a third time period,
          wherein the first time period comprises the third time period, and the second time period comprises the third time period; and
    a memory controller coupled to the memory device and configured to control the memory device.

13. The memory system of claim 12, wherein the first dummy word line is adjacent to the one or more first select lines.

14. The memory system of claim 13, wherein the peripheral circuit is further configured to:
apply a turn-off voltage to the one or more second select lines at least during the second time period.

15. The memory system of claim 12, wherein the first dummy word line is adjacent to the one or more second select lines.

16. A method for programming a memory device, the memory device comprising a memory cell array comprising memory blocks, each memory block comprising:
(i) memory strings, each memory string comprising dummy cells and select transistors,
(ii) bit lines coupled to the memory strings,
(iii) select lines, each select line being coupled to the select transistors, and
(iv) one or more dummy word lines, each dummy word line being coupled to the respective dummy cells, wherein the memory blocks comprise a first memory block, the selected lines in the first memory block comprises one or more first select lines and one or more second select lines, and the dummy word lines in the first memory block comprises a first dummy word line adjacent to either the one or more first select lines or the one or more second select lines, and a second dummy word line, wherein the one or more first select lines are closer to the bit lines than the one or more second select lines, wherein the one or more dummy word lines are between the one or more first select lines and the one or more second select lines, wherein the method comprises:
applying a turn-on voltage to the one or more first select lines in the first memory block during a first time period;
applying a bias voltage to the second dummy word line during a second time period; and
applying a program voltage to the first dummy word line during a third time period,
wherein the first time period comprises the third time period, and the second time period comprises the third time period.

17. The method of claim 16, wherein the first dummy word line is adjacent to the one or more first select lines.

18. The method of claim 17, further comprising:
applying a turn-off voltage to the one or more second select lines at least during the second time period.

19. The method of claim 16, wherein the first dummy word line is adjacent to the one or more second select lines.

20. The method of claim 16, wherein the bias voltage is less than the program voltage.

* * * * *